United States Patent
Kitaoka et al.

(10) Patent No.: US 6,189,119 B1
(45) Date of Patent: Feb. 13, 2001

(54) SEMICONDUCTOR MEMORY DEVICE HAVING TEST MODE

(75) Inventors: Maki Kitaoka; Tsuyoshi Hamamoto; Hideki Yamauchi; Takashi Izutsu, all of Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/111,881

(22) Filed: Jul. 8, 1998

(30) Foreign Application Priority Data

Dec. 24, 1997 (JP) .................................................. 9-354954

(51) Int. Cl.[7] .................................................. G11C 29/00
(52) U.S. Cl. .............................................. 714/718; 714/743
(58) Field of Search .................................. 714/718, 719, 714/723, 738, 743, 742, 744; 365/201, 189.01

(56) References Cited

U.S. PATENT DOCUMENTS

| | | | | |
|---|---|---|---|---|
| 4,429,389 | * | 1/1984 | Catiller | 714/718 |
| 4,701,916 | * | 10/1987 | Naven et al. | 714/742 |
| 5,390,192 | * | 2/1995 | Fujieda | 714/738 |
| 5,781,562 | * | 7/1998 | Saxena | 714/738 |
| 5,831,989 | * | 11/1998 | Fujisaki | 714/723 |
| 5,914,897 | * | 6/1999 | Koyama et al. | 365/189.01 |
| 5,936,975 | * | 8/1999 | Okamura | 714/719 |

FOREIGN PATENT DOCUMENTS

| | | |
|---|---|---|
| 3-038784 | 2/1991 | (JP) . |
| 6-275070 | 9/1994 | (JP) . |
| 97-12746 | 3/1997 | (KR) . |

* cited by examiner

*Primary Examiner*—Hoa T. Nguyen
(74) *Attorney, Agent, or Firm*—McDermott, Will & Emery (57) ABSTRACT

A counter is provided in an SRAM using a CSP (Chip Scale Package). The counter includes n+1 stages of flipflops, counts the number of pulses of an address clock signal when a test signal attains "H" level, and outputs a group of address signals. Compared with a conventional SRAM to which the group of address signals is externally input, the number of external pins necessary when a test is conducted can be reduced, and a test board can be formed using a single-layer interconnection. Consequently, reduction of costs of testing is achieved.

16 Claims, 9 Drawing Sheets

SEMICONDUCTOR MEMORY DEVICE HAVING TEST MODE

BACKGROUND OF THE INVENTION

1. Field of the Invention

The present invention relates to semiconductor memory devices, particularly to a semiconductor memory device having a test mode.

2. Description of the Background Art

As the storage capacity of a semiconductor memory device (SRAM, DRAM, etc.) increases, an increasing number of address signal input terminals and data signal input/output terminals 34 are provided to the semiconductor memory device.

Figure 8:
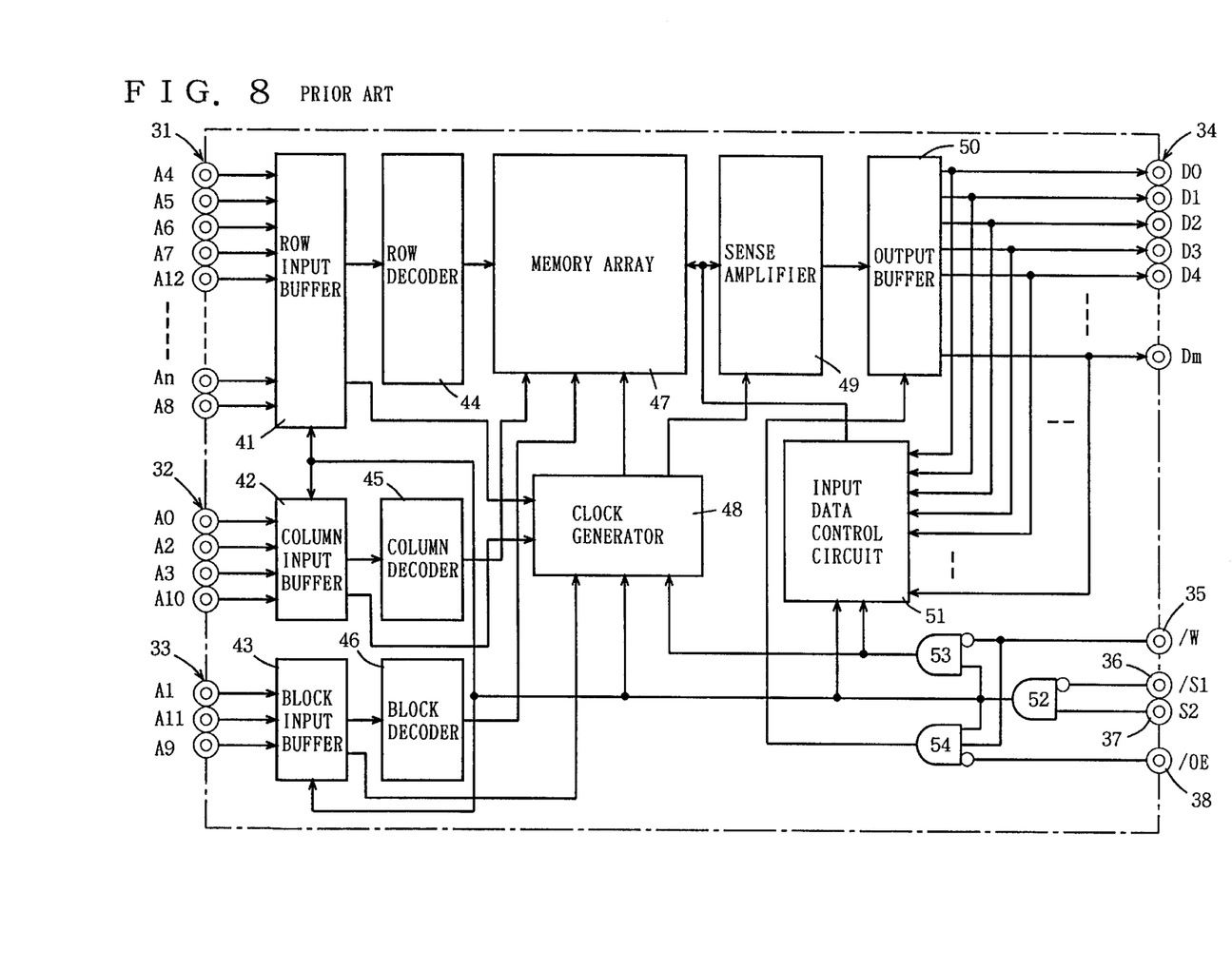
FIG. 8 is a block diagram showing a structure of a conventional SRAM.

FIG. 8 is a block diagram showing an entire structure of an SRAM provided with a number of such address signal input terminals and data signal input/output terminals. Referring to FIG. 8, the SRAM includes groups of address signal input terminals 31–33, a group of data signal input/output terminals 34, and control signal input terminals 35–38.

Address signals A0–An (n is an integer of 0 or more) are externally input to groups of address signal input terminals 31–33. Address signals (e.g. A4–A8, A12–An) for designating a row among address signals A0–An are input to group of address signal input terminals 31. Address signals (e.g. A0, A2, A3, A10) for designating a column among address signals A0–An are supplied to group of address signal input terminals 32. Address signals (e.g. A1, A9, A11) for designating a block among address signals A0–An are input to group of address signal input terminals 33. Group of data signal input/output terminals 34 is used for input/output of data signals D0–Dm (m is an integer of 0 or more). Write control signal /W, chip select signals /S1 and S2 and output enable signal /OE are supplied to control signal input terminals 35–38 respectively.

The SRAM further includes a row input buffer 41, a column input buffer 42, a block input buffer 43, a row decoder 44, a column decoder 45, a block decoder 46, a memory array 47, a clock generator 48, a sense amplifier 49, an output buffer 50, an input data control circuit 51, and gate circuits 52–54.

Row input buffer 41 generates amplification signals and inversion-amplification signals of address signals A4–A8 and A12–An supplied externally via address signal input terminal group 31, and supplies the generated signals to row decoder 44 and clock generator 48.

Column input buffer 42 generates amplification signals and inversion-amplification signals of address signals A0, A2, A3 and A10 input from address signal input terminal group 32, and supplies the generated signals to column decoder 45 and clock generator 48.

Block input buffer 43 generates amplification signals and inversion-amplification signals of address signals A1, A9 and A11 supplied externally via address signal input terminal group 33, and supplies the generated signals to block decoder 46 and clock generator 48.

Memory array 47 is divided into a plurality of memory blocks. Each memory block includes a plurality of memory cells each storing data of 1 bit. The memory cells are grouped in advance such that each group includes m+1 cells. The number of memory cells in each group m+1 is equal to the number of data signal input/output terminals. Each memory cell group is arranged at a prescribed address determined by a row address, a column address and a block address.

Row decoder 44 designates a row address in memory array 47 according to the amplification signals and inversion-amplification signals of address signals A4–A8 and A12–An supplied from row input buffer 41. Column decoder 45 designates a column address in memory array 47 according to the amplification signals and inversion-amplification signals of address signals A0, A2, A3 and A10 supplied from column input buffer 42. Block decoder 46 designates a block address in memory array 47 according to the amplification signals and inversion-amplification signals of address signals A1, A11 and A9 supplied from block input buffer 43.

Clock generator 48 and gate circuits 52–54 select a prescribed operation mode according to signals /W, /S1, S2, and /OE supplied externally via control signal input terminals 35–38 as well as the amplification signals and inversion-amplification signals of address signals A0–An supplied from input buffers 41–43, and controls the entire SRAM.

In a reading mode, sense amplifier 49 reads data signals D0–Dm from a memory cell group located at an address designated by decoders 44–46. Output buffer 50 outputs data signals D0–Dm read by sense amplifier 49 externally via data signal input/output terminal group 34 in the read mode. In a write mode, input data control circuit 51 writes data signals D0–Dm supplied externally via data signal input/output terminal group 34 into a memory cell group located at an address designated by decoders 44–46.

An operation of the SRAM shown in FIG. 8 is hereinafter described briefly. In a writing operation, signals /W and /S1 are at "L" level, signals S2 and /OE are at "H" level, address signals A0–An are supplied to groups of address signal input terminals 31–33, and write data signals D0–Dm are supplied to data signal input/output terminal group 34. Decoders 44–46 designate any memory cell group in memory array 47 according to address signals A0–An. Externally supplied data signals D0–Dm are written by input data control circuit 51 into the memory cell group designated by decoders 44–46.

In a reading operation, signals /OE and /S1 are at "L" level, signals S2 and /W are at "H" level, and address signals A0–An are supplied to groups of address signal input terminals 31–33. Decoders 44–46 designate any memory cell group in memory array 47 according to address signals A0–An. Sense amplifier 49 reads data D0–Dm in the memory cell group designated by decoders 44–46. Data D0–Dm read by sense amplifier 49 are output to data signal input/output terminal group 34 by output buffer 50.

A burn-in test for acceleratedly causing any initial failure is applied to such an SRAM prior to delivery, in order to eliminate early failures caused after delivery. The burn-in test is conducted by placing a number of SRAMs on a single test board, supplying address signals A0–An and data signals D0–Dm in parallel to the group of SRAMs, and driving the SRAMs under extreme conditions (high temperature, high supply voltage etc.) severer than normal conditions.

Figure 9:
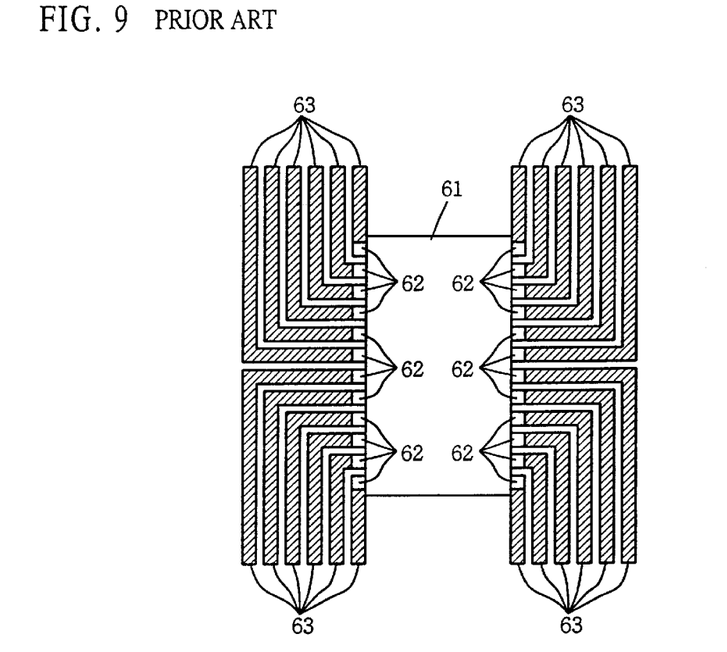
FIG. 9 is provided for describing a burn-in test conducted for the SRAM shown in FIG. 8.

If a conventional package such as the SOP (Small Outline Package) or TSOP (Thin Small Outline Package) is used for an SRAM, external pins 62 are arranged around only the periphery of a package 61 as shown in FIG. 9. In this case, interconnection lines 63 on the test board can be constituted of a single-layer interconnection.

Figure 10:
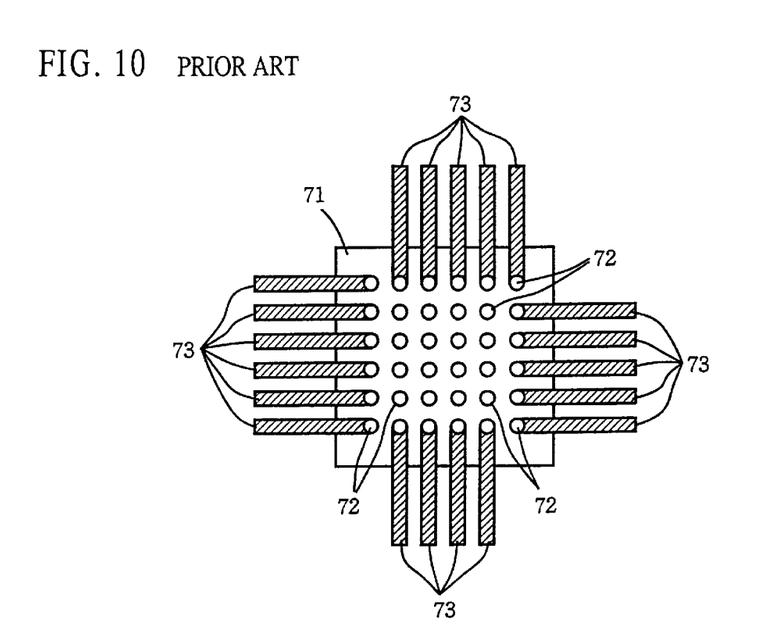
FIG. 10 is provided for describing a problem of the conventional SRAM described using FIGS. 8 and 9.

However, if a modern small package such as the CSP (Chip Scale Package) is used for an SRAM, external pins 72 are arranged in rows and columns at the bottom surface of a package 71 as shown in FIG. 10. If interconnection lines 73 on the test board is constituted of the single-layer interconnection, interconnection lines 73 cannot be connected to external pins 72 located at the central portion even if interconnection lines 73 can be connected to external pins 72 arranged around the periphery of the bottom surface of the package 71. Although interconnection lines 73 on the test board can be constituted of a multi-layer interconnection to allow all of the external pins 72 to be connected to interconnection lines 73, the higher cost of the test board leads to increase in the cost of testing.

SUMMARY OF THE INVENTION

An object of the present invention is to provide a semiconductor memory device by which the cost of testing can be decreased.

A first semiconductor memory device according to the present invention is briefly described as the one provided with a counter counting the number of pulses (pulse number) of an external clock signal and designating each of a plurality of addresses according to a value of the counted number in a test mode, and with a data input/output circuit inputting/outputting data to/from a memory cell located at the address designated by the counter from/to an external portion. Consequently, the number of external pins used in the test mode can be decreased to reduce the number of interconnection lines of a test board, compared with a conventional semiconductor memory device by which an address is designated by a plurality of external address signals. The test board can be formed using a single-layer interconnection so that the costs of the test board as well as of testing can be decreased.

A second semiconductor memory device according to the present invention is briefly described as the one provided with a first counter including multi-stage flipflops which count the pulse number of a first clock signal and output a plurality of address signals in the test mode, and with a write circuit writing data to each of a prescribed number of memory cells belonging to a memory cell group located at an address designated by the plurality of address signals supplied from the first counter. Consequently, the number of external pins used in the test mode can be decreased to reduce the number of interconnection lines of the test board compared with a conventional semiconductor memory device by which an address is designated by a plurality of external address signals. The test board can be formed using a single-layer interconnection to achieve decrease in the costs of the test board and of testing.

Preferably, a second counter including a prescribed number of stages of flipflops that count the pulse number of a second clock signal and that output a prescribed number of data in the test mode is further provided, and the write circuit writes the prescribed number of data supplied from the second counter into the prescribed number of memory cells belonging to the memory cell group located at the address designated by the first counter. In this case, a plurality of data that are externally input are internally generated, so that the number of external pins used in the test mode can be further decreased.

Preferably, the first and second clock signals are the same external clock signal. In this case, an address signal and data can be synchronized with each other accurately.

Preferably, the second clock signal is any of a plurality of address signals output from the first counter. In this case, an address signal and data can be synchronized with each other accurately.

Still preferably, a group of external pins arranged in rows and columns is further provided, and the write circuit writes, in a normal operation, a prescribed number of external data input from the external pin group respectively to a prescribed number of memory cells belonging to a memory cell group located at an address designated by a plurality of external address signals input from the external pin group. The present invention is especially effective if such an external pin group is provided.

A third semiconductor memory device is described briefly as the one which is provided with a counter including flipflops of a prescribed number of stages that count the pulse number of an external clock signal and that output a prescribed number of data in the test mode, and with a write circuit writing the prescribed number of data output from the counter into a prescribed number of memory cells belonging to any memory cell group. Consequently, the number of external pins used in the test mode can be decreased to reduce the number of interconnection lines of the test board compared with the conventional semiconductor memory device by which a plurality of data are externally input. The test board can be formed using a single-layer interconnection so that the costs of the test board and of testing can be reduced.

Preferably, the first to the third semiconductor memory devices are each an SRAM. The present invention is particularly effective when the invention is applied to the SRAM.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
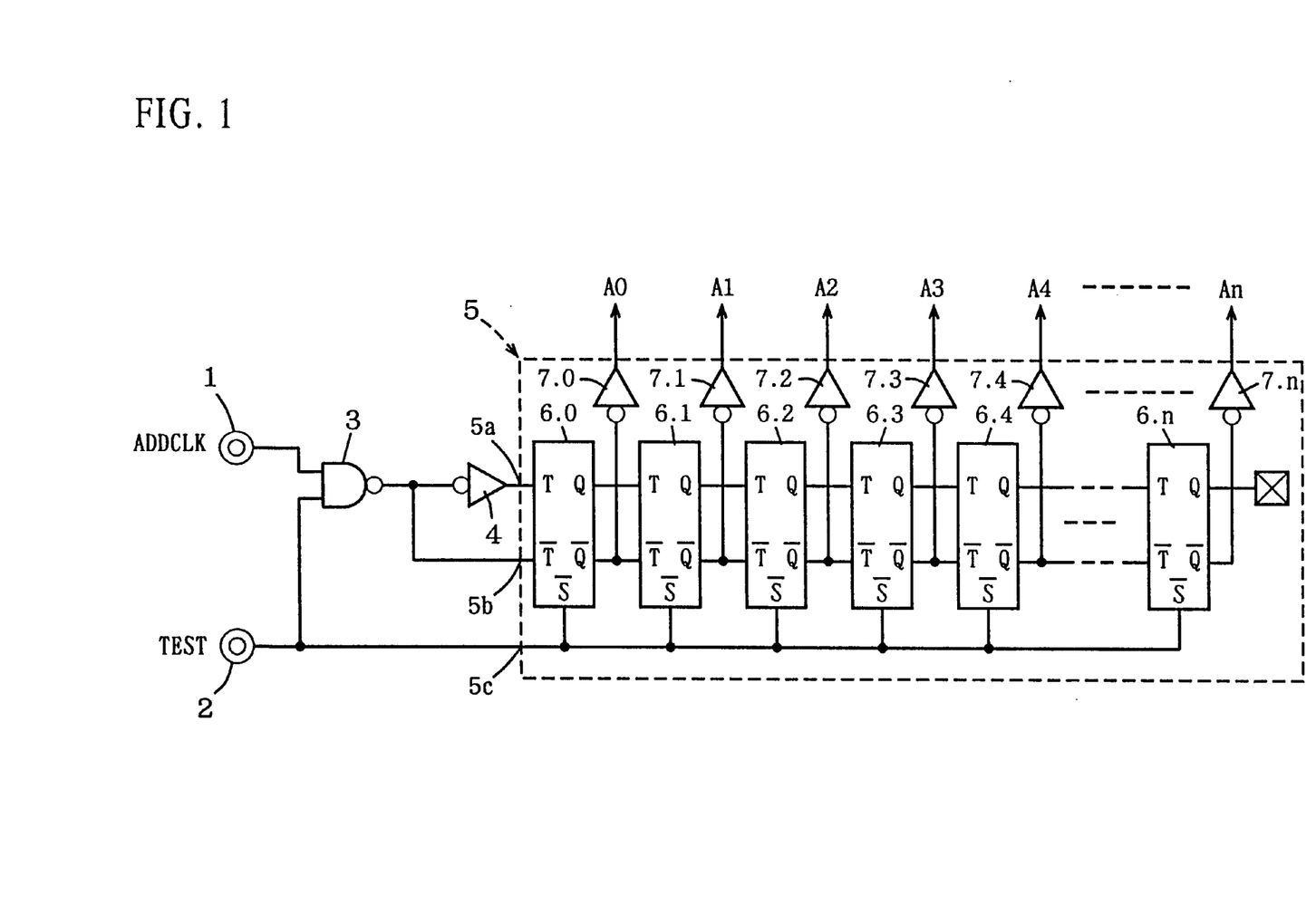
FIG. 1 is a block diagram showing a structure of a main portion of an SRAM according to the first embodiment of the invention.
Figure 2A:
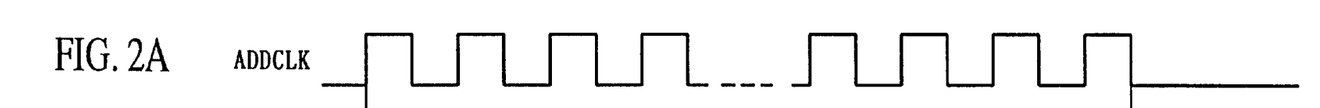
FIGS. 2A–2E are timing charts each showing an operation of an address generation circuit shown in FIG. 1.
Figure 2B:
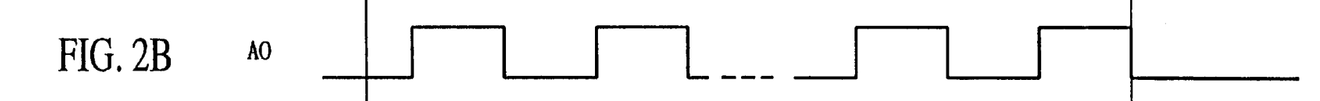
Figure 2C:
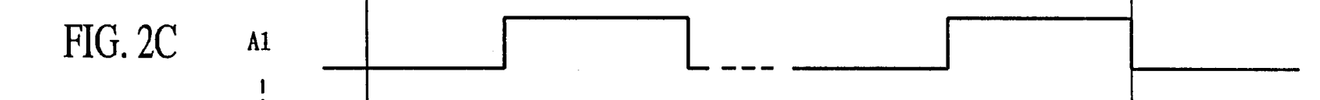
Figure 2D:
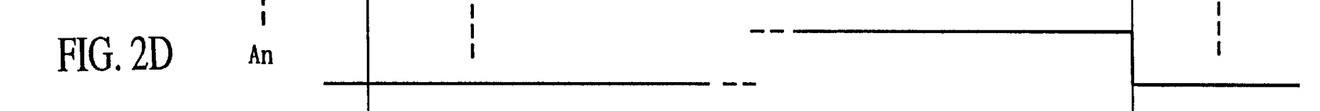
Figure 2E:
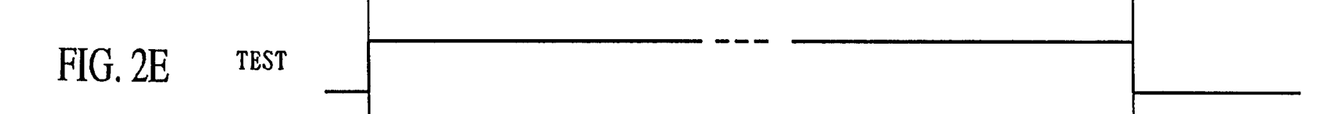

FIG. 1 is a circuit block diagram showing a structure of a main portion of an SRAM according to the first embodiment of the invention. Referring to FIG. 1, a difference between the SRAM and the conventional SRAM shown in FIG. 8 is that an address generation circuit including an address clock input terminal 1, a test signal input terminal 2, an NAND gate 3, an inverter 4, and a counter 5 is newly provided. Address clock input terminal 1 is any terminal (e.g. a terminal to which address signal An is input) among groups of address signal input terminals 31–33 shown in FIG. 8.

When the burn-in test is conducted, address clock signal ADDCLK is input externally to address clock input terminal 1. Test signal TEST is externally input to test signal input terminal 2 when the burn-in test is conducted.

NAND gate 3 receives address clock signal ADDCLK and test signal TEST. A signal output from NAND gate 3 is input to an input terminal 5a of counter 5 via inverter 4, and directly input to an inversion input terminal 5b of counter 5. A preset terminal 5c of counter 5 receives test signal TEST.

Counter 5 includes flipflops 6.0–6.n and inverters 7.0–7.n. Preset terminals IS of respective flipflops 6.0–6.n are commonly connected to preset terminal 5c of counter 5. An input terminal T and an inversion input terminal /T of flipflop 6.0 of the first stage are respectively connected to input terminal 5a and inversion input terminal 5b of counter 5.

Input terminals T and inversion input terminals IT of flipflops 6.1–6.n are respectively connected to output terminals Q and inversion output terminals /Q of respective flipflops 6.0–6.n-1 of a preceding stage. Inversion output signals from flipflops 6.0–6.n are respectively input to inverters 7.0–7.n. Outputs from inverters 7.0–7.n are respectively address signals A0–An supplied to input buffers 41–43 of FIG. 8.

FIGS. 2A–2E are timing charts each showing an operation of the address generation circuit of FIG. 1. According to the timing charts, an operation of the SRAM when the burn-in test is applied to the SRAM is described below. When the burn-in test is conducted, the SRAM is placed on a test board together with a plurality of SRAMs of the same type, as the burn-in test is applied to the conventional SRAM. Instead of address signals A0–An, signals ADDCLK and TEST are input to each SRAM.

When the test is started, test signal TEST is at "L" level. Accordingly, an output from NAND gate 3 is fixed at "H" level, input of address clock signal ADDCLK to counter 5 is blocked, counter 5 is preset, and output signals A0–An of counter 5 are all "0".

Simultaneously with start of writing or reading of data at time t0, test signal TEST rises to "H" level. Accordingly, NAND gate 3 functions as an inverter for address clock signal ADDCLK, address clock signal ADDCLK is input to counter 5, and preset of counter 5 is canceled. Counter 5 counts the number of pulses (pulse number) of address clock signal ADDCLK, and an increment (of +1) is given to a value of the number counted by counter 5, that is, to address signals A0–An, every time a pulse is supplied. When writing or reading of data into or from memory cell groups located at all addresses is completed and the test is ended, test signal TEST falls to "L" level and counter 5 is preset.

Figure 3:
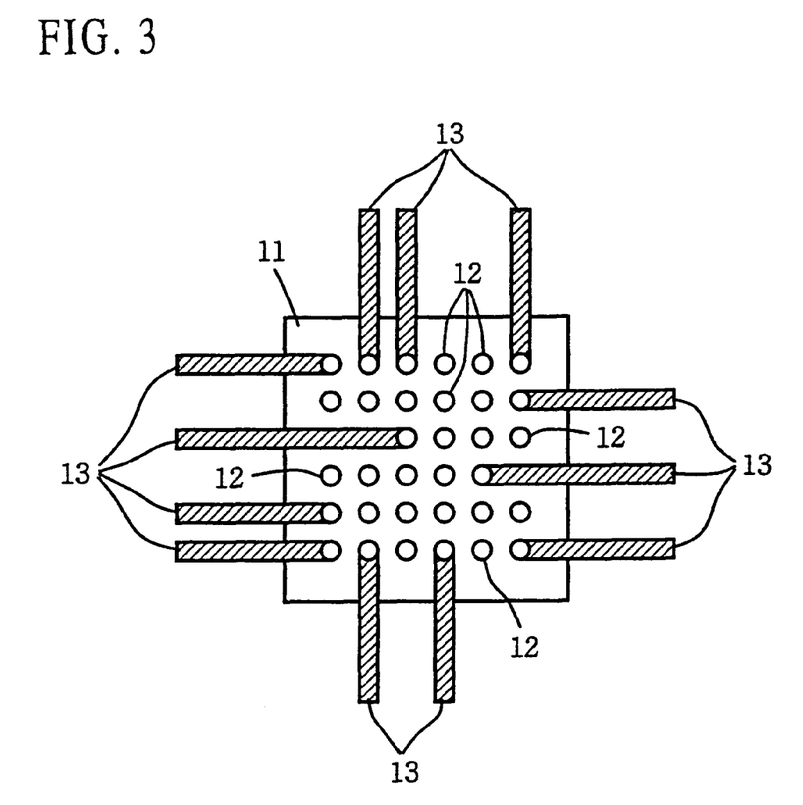
FIG. 3 is provided for describing an effect of the SRAM shown by FIG. 1 and FIGS. 2A–2E.

According to this embodiment, address signals A0–An are generated in the SRAM by counting the pulse number of address clock signal ADDCLK input from one address clock input terminal 1 when the test is conducted. As a result, the number of interconnection lines on a test board can be dramatically reduced compared with the conventional SRAM to which address signals A0–An are externally supplied from n+1 address signal input terminals. Therefore, even if an SRAM using a CSP 11 shown in FIG. 3 is tested, the number of interconnection lines 13 can be significantly reduced compared with the conventional SRAM. As a result, a single-layer interconnection is enough for connection to external pins 12 located at the central portion of the bottom surface of CSP 11. Accordingly, a multi-layer interconnection of the test board is unnecessary even if an SRAM using CSP 11 is tested, resulting in reduction of the costs of the test board and of testing.

A part of or all of output signals from inverters 7.0–7.n of the address generation circuit may be used as not only address signals A0–An but data signals D0–Dm.

(Second Embodiment)

Figure 4:
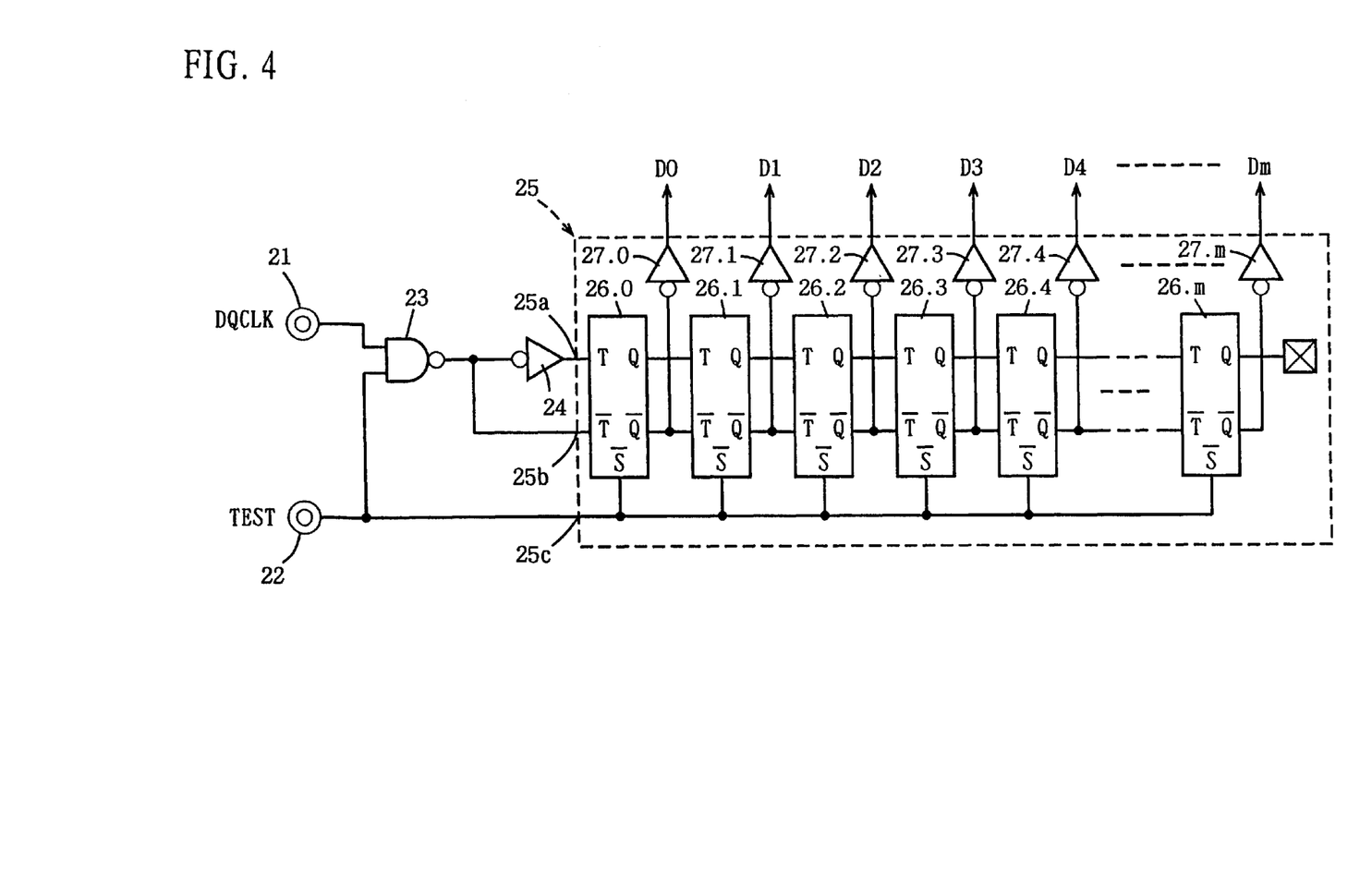
FIG. 4 is a block diagram showing a structure of a main portion of an SRAM according to the second embodiment of the invention.
Figure 5A:
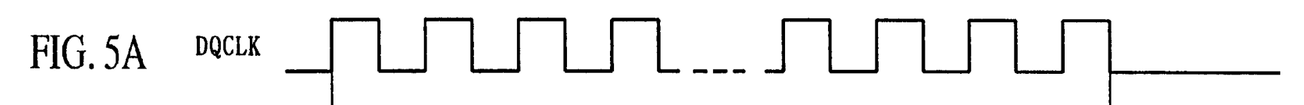
FIGS. 5A–5E are timing charts each showing an operation of a data generation circuit shown in FIG. 4.
Figure 5B:
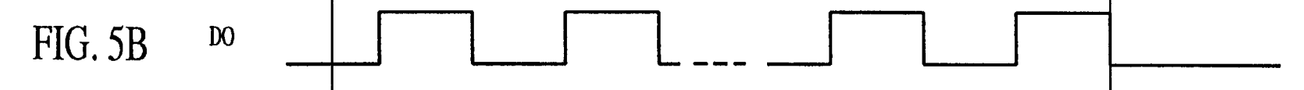
Figure 5C:
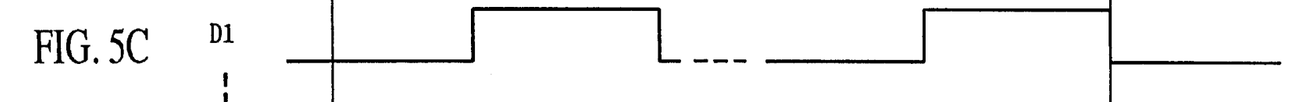
Figure 5D:
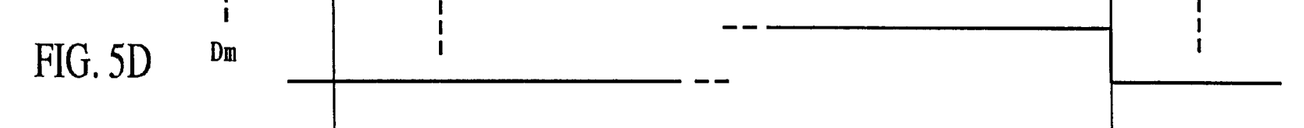
Figure 5E:
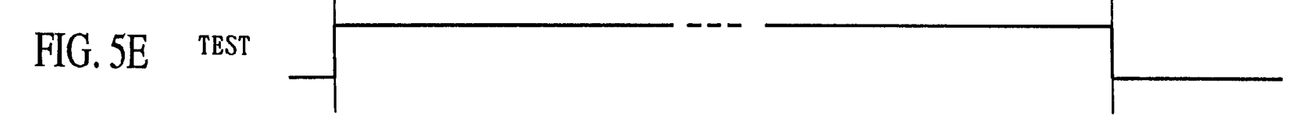

FIG. 4 is a circuit block diagram showing a structure of a main portion of an SRAM according to the second embodiment of the invention. Referring to FIG. 4, a difference between the SRAM and the conventional SRAM shown in FIG. 8 is that a data generation circuit including a data clock input terminal 21, a test signal input terminal 22, an NAND gate 23, an inverter 24, and a counter 25 is newly provided. Data clock input terminal 21 is any terminal (e.g. a terminal to/from which data signal Dn is input/output) among group of data signal input/output terminals 34 of FIG. 8.

When the burn-in test is applied, data clock signal DQCLK is externally input to data clock input terminal 21. Test signal TEST is externally input to test signal input terminal 22 when the burn-in test is conducted.

Data clock signal DQCLK and test signal TEST are supplied to NAND gate 23. A signal output from NAND gate 23 is supplied to an input terminal 25a of counter 25 via inverter 24, and directly to an inversion input terminal 25b of counter 25. A preset terminal 25c of counter 25 receives test signal TEST.

Counter 25 includes flipflops 26.0–26.m and inverters 27.0–27.m. A preset terminal /S of each of flipflops 26.0–26.m is connected to preset terminal 25c of counter 25. An input terminal T and an inversion input terminal /T of flipflop 26.0 of the first stage are respectively connected to input terminal 25a and inversion input terminal 25b of counter 25.

Input terminals T and inversion input terminals /T of flipflops 26.1–26.m are respectively connected to output terminals Q and inversion output terminals /Q of respective flipflops 26.0–26.m-1 of a preceding stage. Inversion output signals of respective flipflops 26.0–26.m are input to inverters 27.0–27.m respectively. Outputs from inverters 27.0–27.m are data signals D0–Dm to be input to input data control circuit 51 of FIG. 8.

FIGS. 5A–5E are timing charts each showing an operation of the data generation circuit shown in FIG. 4. According to the timing charts, an operation of the SRAM when the burn-in test is applied thereto is described. When the burn-in test is conducted, the SRAM is placed on a test board together with a number of SRAMs of the same type, as the test is applied to the conventional SRAM. Instead of data signals D0–Dm, signals DQCLK and TEST are externally supplied to each SRAM.

At the start of the test, test signal TEST is at "L" level. Accordingly, an output from NAND gate 23 is fixed at "H" level, input of data clock signal DQCLK to counter 25 is blocked, counter 25 is preset, and output signals D0–Dm from counter 25 are all at "L" level.

At the same time that writing or reading of data is started at time t0, test signal TEST rises to "H" level. Accordingly, NAND gate 23 operates as an inverter for data clock signal DQCLK, data clock signal DQCLK is input to counter 25, and preset of counter 25 is canceled. Counter 25 counts the pulse number of data clock signal DQCLK, and an increment (of +1) is given to a value of the number counted by counter 25, that is, to data signals D0–Dm, every time a pulse is input. When writing or reading of data into or from memory cell groups located at all addresses is completed and the test is ended, test signal TEST falls to "L" level and counter 25 is preset.

According to this embodiment, data signals D0–Dm are generated in the SRAM by counting the number of pulses of data clock signal DQCLK input from one data clock input terminal 21 when the test is conducted. Therefore, the number of interconnection lines on the test board can be significantly reduced compared with the conventional SRAM to which data signals D0–Dm are externally supplied from group of m+1 data signal input/output terminals 34. Consequently, as shown in a FIG. 3, single-layer interconnection is enough for connection to external pins 12 located at the central portion of the bottom surface of CSP 11 since the number of interconnection lines 13 can be dramatically reduced compared with the conventional SRAM, even if an SRAM using CSP 11 is tested. A multi-layer interconnection is unnecessary for the test board even if an SRAM using CSP 11 is tested, resulting in reduction of the costs of the test board and testing.

The first and second embodiments may be combined such that the address generation circuit of FIG. 1 and the data generation circuit of FIG. 4 are both provided in a single SRAM. In this case, the number of interconnection lines for a test board can be further reduced.

Figure 6:
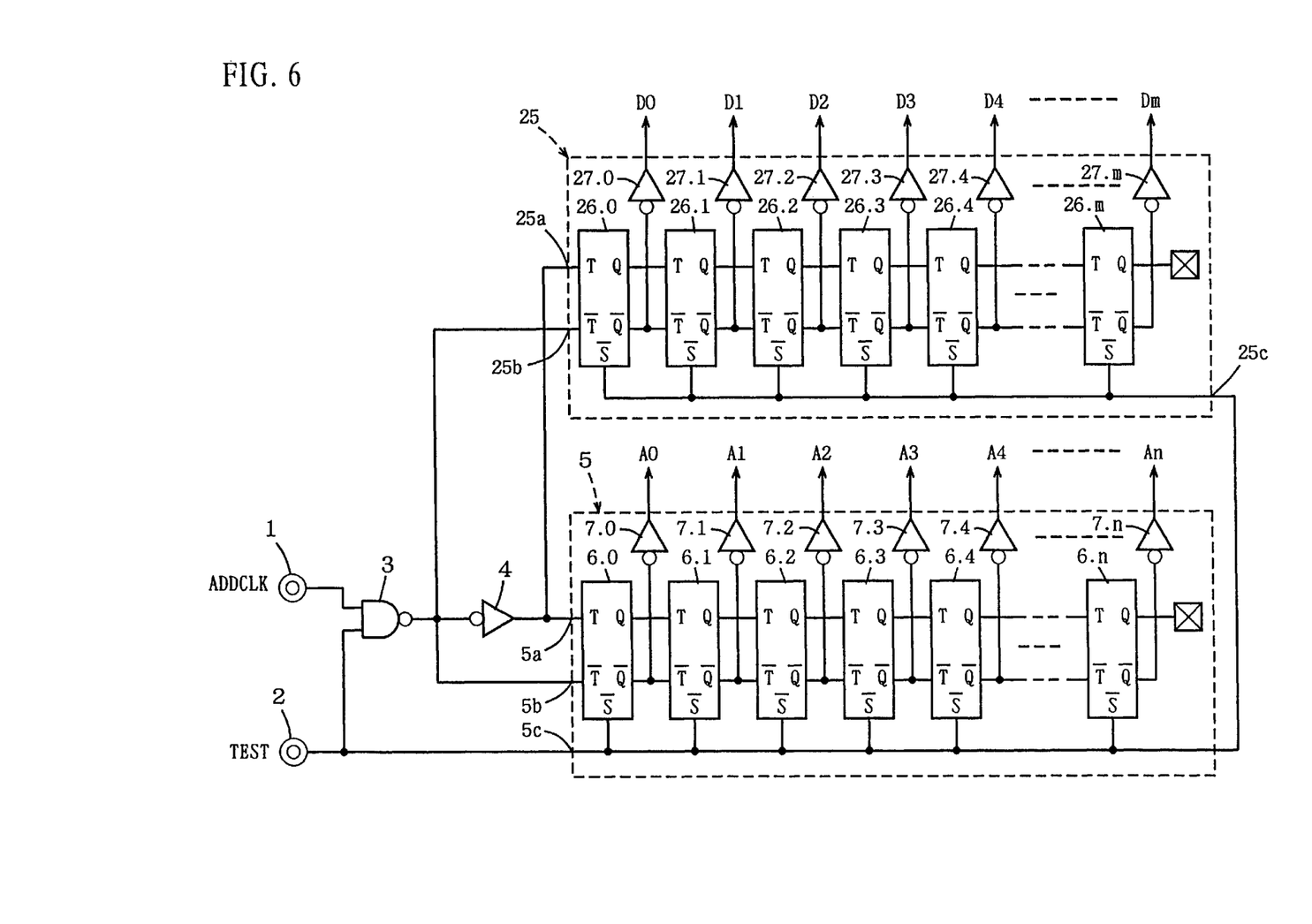
FIG. 6 is a block diagram showing an example of an improvement of the SRAM shown by FIG. 4 and FIGS. 5A–5E.

Referring to FIG. 6, if the first and second embodiments are combined, data clock input terminal 21, test signal input terminal 22, NAND gate 23, and inverter 24 may be omitted and counter 25 of the data generation circuit may be connected in parallel with counter 5 of the address generation circuit. The layout area is thus reduced and address signals A0–An can be surely synchronized with data signals D0–Dm.

Figure 7:
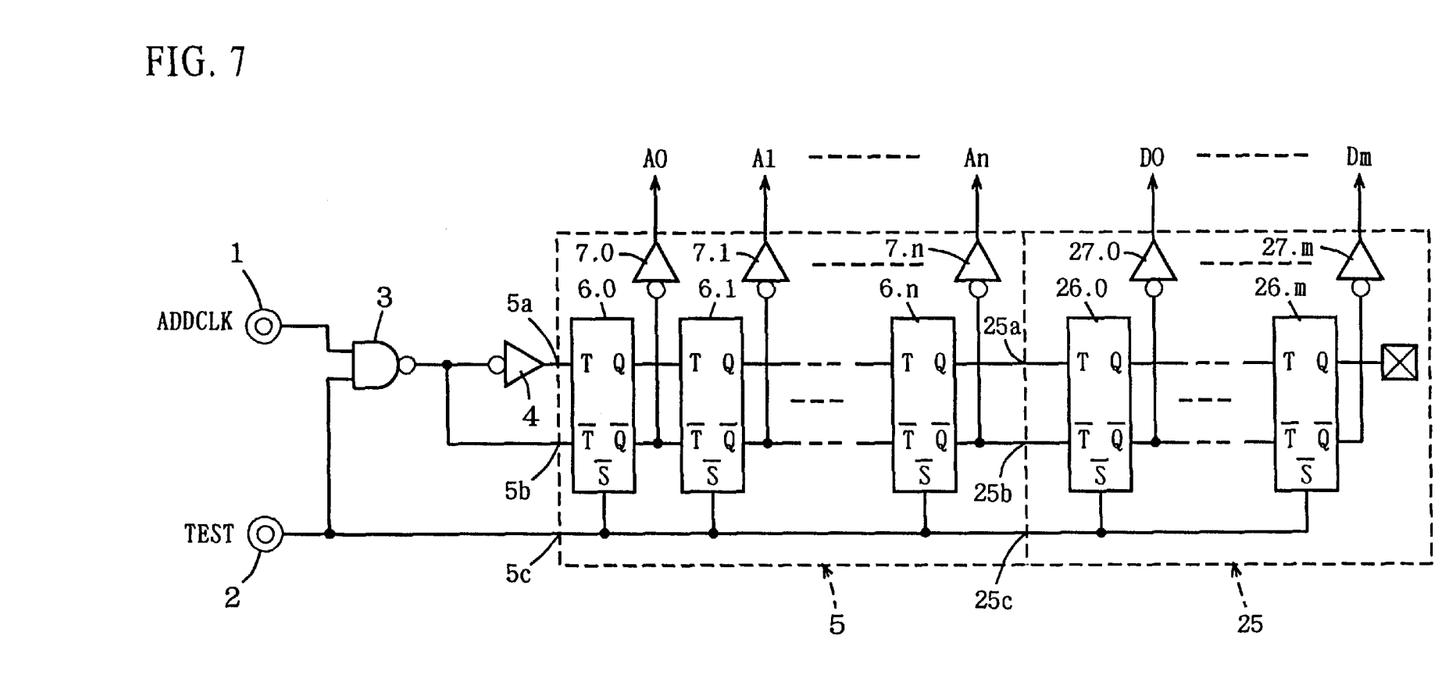
FIG. 7 is a block diagram showing another improvement of the SRAM shown by FIGS. 4 and FIGS. 5A–5E.

Referring to FIG. 7, data clock input terminal 21, test signal input terminal 22, NAND gate 23 and inverter 24 may be omitted and counter 25 of the data generation circuit may be connected serially to counter 5 of the address generation circuit as a subsequent stage.

Although not shown in the figures, input terminal 25a and inversion input terminal 25b of counter 25 of the data generation circuit may be respectively connected to output terminal Q and inversion output terminal /Q of any flipflop (e.g. 6.0) among flipflops 6.0–6.n of counter 5 of the address generation circuit.

In addition, a part of or all of output signals from inverters 27.0–27.m of the data generation circuit may be used as not only data signals D0–Dm but address signals A0–An.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode, comprising:
   a memory array including a plurality of memory cells grouped in advance such that each memory cell group includes a prescribed number of memory cells and each memory cell group has a specific address allocated;
   a first counter including multi-stage flipflops connected in series that count number of pulses of a first clock signal input to a first stage and that output a plurality of address signals for designating the address of said memory cell group in said test mode; and
   a write circuit configured to write data to each of the prescribed number of memory cells belonging to the memory cell group located at the address designated by the plurality of address signals output from said first counter.

2. The semiconductor memory device according to claim 1, wherein
   said semiconductor memory device is an SRAM.

3. The semiconductor memory device according to claim 1, further comprising a second counter including a prescribed number of stages of flipflops connected in series that count number of pulses of a second clock signal input to a first stage and that output a prescribed number of data to be written into the prescribed number of memory cells belonging to said memory cell group in said test mode, wherein
   said write circuit writes the prescribed number of data output from said second counter into the prescribed number of memory cells belonging to the memory cell group located at the address designated by the plurality of address signals output from said first counter.

4. The semiconductor memory device according to claim 3, wherein
   said first and second clock signals are a same external clock signal.

5. The semiconductor memory device according to claim 3, wherein
   said second clock signal is any of the plurality of address signals output from said first counter.

6. The semiconductor memory device according to claim 3, further comprising a group of external pins arranged in rows and columns for inputting a group of external signals including a plurality of external address signals for designating the address of said memory cell group and including a prescribed number of external data to be written into the prescribed number of memory cells belonging to said memory cell group, wherein
   said write circuit writes said prescribed number of external data into the prescribed number of memory cells belonging to the memory cell group located at the address designated by said plurality of external address signals in a normal operation.

7. A semiconductor memory device having a test mode, comprising:
   a memory array including a plurality of memory cells grouped in advance such that memory cell groups each includes a prescribed number of memory cells and each memory cell group has a specific address allocated;
   a counter including a prescribed number of stages of flipflops connected in series that count number of pulses of an external clock signal input to a first stage and that output a prescribed number of data to be written into the prescribed number of memory cells belonging to said memory cell group in said test mode; and
   a write circuit configured to write the prescribed number of data output from said counter into the prescribed number of memory cells belonging to any memory cell group among a plurality of said memory cell groups.

8. The semiconductor memory device according to claim 7, wherein
   said semiconductor memory device is an SRAM.

9. A semiconductor memory device having a test mode, comprising:

a memory array including a plurality of memory cells, each having a specific address allocated thereto;

a first counter including multi-stage flipflops connected in series that count number of pulses of a first clock signal input to a first stage and that output a plurality of address signals for designating the address of said memory cell in said test mode; and a write circuit configured to write data to the memory cell located at the address designated by the plurality of address signals output from said first counter.

10. The semiconductor memory device according to claim 9, wherein said semiconductor memory is an SRAM.

11. The semiconductor memory device according to claim 9, further comprising a second counter including a flipflop which counts number of pulses of a second clock signal and outputs data to be written into the memory cell in said test mode, wherein said write circuit writes the data output from said second counter into the memory cell located at the address designated by the plurality of address signals output from said first counter.

12. The semiconductor memory device according to claim 11, wherein said first and second clock signals are a same external clock signal.

13. The semiconductor memory device according to claim 11, wherein said second clock signal is any of the plurality of address signals output from said first counter.

14. The semiconductor memory device according to claim 11, further comprising a group of external pins arranged in rows and columns for inputting a group of external signals including a plurality of external address signals for designating the address of said memory cell and including external data to be written into the memory cell, wherein said write circuit writes said external data into the memory cell located at the address designated by said plurality of external address signals in a normal operation.

15. A semiconductor memory device having a test mode, comprising:

a memory array including a plurality of memory cells, each having a specific address allocated thereto;

a counter including a flipflop which counts the number of pulses of an external clock signal and which outputs data to be written into the memory cell in said test mode; and a write circuit configured to write the data output from said counter into any memory cell among said plurality of memory cells.

16. The semiconductor memory device according to claim 15, wherein said semiconductor memory device is an SRAM.

* * * * *